US011528819B2

(12) United States Patent
Lee

(10) Patent No.: US 11,528,819 B2
(45) Date of Patent: Dec. 13, 2022

(54) FOLDABLE DISPLAY MODULE AND ELECTRONIC DEVICE INCLUDING THE SAME

(71) Applicant: Samsung Electronics Co., Ltd., Suwon-si (KR)

(72) Inventor: Taekyung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 17/106,823

(22) Filed: Nov. 30, 2020

(65) Prior Publication Data
US 2021/0168953 A1 Jun. 3, 2021

(30) Foreign Application Priority Data

Nov. 29, 2019 (KR) .................. 10-2019-0156746

(51) Int. Cl.
*H05K 5/02* (2006.01)
*H05K 5/00* (2006.01)
*H01L 51/52* (2006.01)
*H01L 27/32* (2006.01)

(52) U.S. Cl.
CPC ....... *H05K 5/0226* (2013.01); *H01L 51/5237* (2013.01); *H05K 5/0017* (2013.01); *H01L 27/3244* (2013.01); *H01L 2251/5338* (2013.01)

(58) Field of Classification Search
CPC .. H05K 5/0226; H05K 5/0017; G06F 1/1641; G06F 1/1652; G06F 1/1681; G06F 1/1616; G06F 2203/04102; H04M 1/0216; H04M 1/0268; H04M 1/18; G09F 9/301
See application file for complete search history.

(56) References Cited

U.S. PATENT DOCUMENTS 7,515,406 B2 4/2009 Kee et al.
9,811,119 B2 11/2017 Seo
10,067,536 B1 9/2018 Watamura
(Continued)

FOREIGN PATENT DOCUMENTS

KR 10-2008-0093340 A 10/2008
KR 10-2019-0001864 A 1/2019
KR 10-2020-0137902 A 12/2020

OTHER PUBLICATIONS

International Search Report dated Mar. 18, 2021, issued in International Application No. PCT/KR2020/017284.

*Primary Examiner* — Abhishek M Rathod
(74) *Attorney, Agent, or Firm* — Jefferson IP Law, LLP

(57) ABSTRACT

An electronic device is provided. The electronic device includes a first housing, a second housing connected to the first housing so as to be foldable, with a folding axis between the first housing and the second housing, a display module including a first area, a second area, and a folding area, and a plate disposed on a rear surface of the display module, the plate including a first plate coupled to the first area and a second plate coupled to the second area. The first plate includes a first slit area including a plurality of first extensions extending toward the second plate and a plurality of first slits formed between the plurality of first extensions. The second plate includes a second slit area including a plurality of second extensions extending toward the first plate and a plurality of second slits formed between the plurality of second extensions.

20 Claims, 9 Drawing Sheets

(56) References Cited

U.S. PATENT DOCUMENTS

| | | |
|---|---|---|
| 10,674,617 B2 | 6/2020 | Lin et al. |
| 10,727,435 B2 | 7/2020 | Kim et al. |
| 11,129,287 B2 | 9/2021 | Hsu |
| 11,258,035 B2 | 2/2022 | Kim et al. |
| 2008/0253073 A1 | 10/2008 | Kee et al. |
| 2015/0055287 A1 | 2/2015 | Seo |
| 2016/0209874 A1* | 7/2016 | Choi ................. H05K 1/028 |
| 2018/0024593 A1 | 1/2018 | Seo |
| 2018/0097197 A1* | 4/2018 | Han ................. G06F 1/1677 |
| 2018/0151835 A1* | 5/2018 | Kim ................. H01L 33/56 |
| 2018/0181164 A1* | 6/2018 | Chen ................. G06F 1/1624 |
| 2018/0188778 A1* | 7/2018 | Shin ................. G06F 1/1624 |
| 2018/0197933 A1* | 7/2018 | Son ................. H01L 51/5281 |
| 2018/0335679 A1* | 11/2018 | Hashimoto ......... G02F 1/16753 |
| 2018/0343756 A1 | 11/2018 | Lin et al. |
| 2019/0036068 A1 | 1/2019 | Kim et al. |
| 2019/0302848 A1* | 10/2019 | Han ................. G06F 1/1641 |
| 2019/0334114 A1* | 10/2019 | Park ................. H05K 5/0017 |
| 2020/0068725 A1* | 2/2020 | Park ................. H01L 51/5237 |
| 2020/0225711 A1* | 7/2020 | Pelissier ............. G06F 1/1652 |
| 2020/0321551 A1 | 10/2020 | Kim et al. |
| 2020/0352044 A1 | 11/2020 | Hsu |

\* cited by examiner

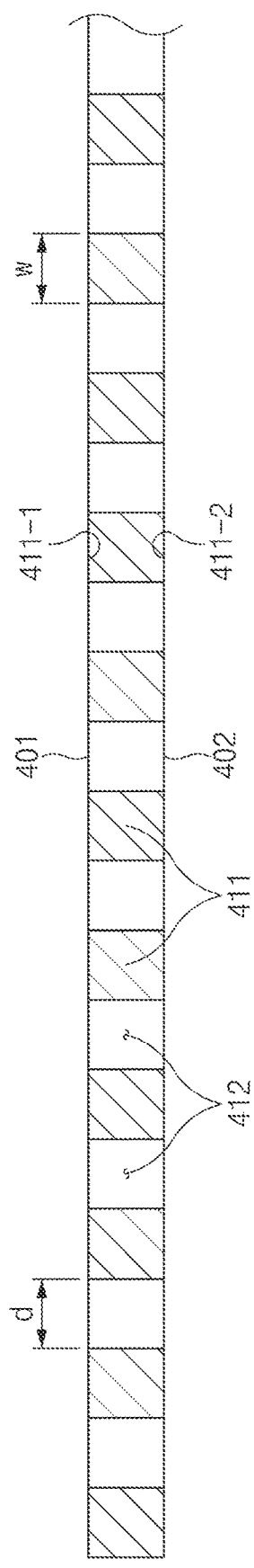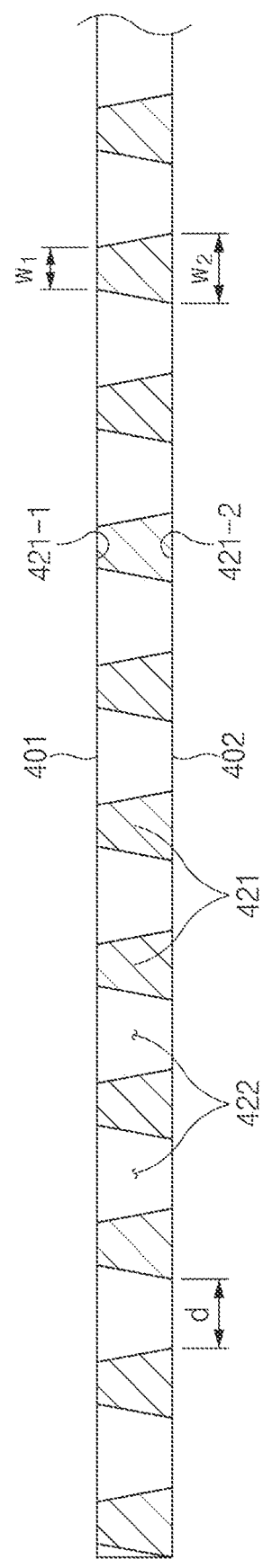
FIG. 9A
FIG. 9B

FOLDABLE DISPLAY MODULE AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2019-0156746, filed on Nov. 29, 2019, in the Korean Intellectual Property Office, the disclosure of which is incorporated by reference herein its entirety.

BACKGROUND

1. Field

The disclosure relates to a foldable display module and an electronic device including the same.

2. Description of Related Art

A foldable display module may include a flexible display having a partial area that can be bent or unbent. The partial area may be deformed from a flat surface to a curved surface, and accordingly the foldable display module may be folded.

A foldable electronic device including the foldable display module may include a folded state in which a partial area is curved and a flat state in which the entire area is substantially flat.

The above information is presented as background information only to assist with an understanding of the disclosure. No determination has been made, and no assertion is made, as to whether any of the above might be applicable as prior art with regard to the disclosure.

SUMMARY

The foldable display module may be formed to be flexible. The foldable display module may include a plate that supports a rear surface of the foldable display module. The plate may be formed to be rigid. In a folded state, a partial area of the plate may be spaced apart from the rear surface of the foldable display module. At this time, the rear surface of the foldable display module may be exposed to an interior space of the foldable electronic device, and foreign matter may be located on the rear surface of the foldable display module. In a flat state, the foreign matter may cause damage to the foldable display module.

Aspects of the disclosure are to address at least the above-mentioned problems and/or disadvantages and to provide at least the advantages described below. Accordingly, an aspect of the disclosure is to provide a display module for preventing damage caused by foreign matter introduced between the display module and a plate, and an electronic device including the display module.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing connected to the first housing so as to be foldable, with a folding axis between the first housing and the second housing, a display module including a first area disposed on the first housing and formed to be a flat surface, a second area disposed on the second housing and formed to be a flat surface, and a folding area formed between the first area and the second area and formed to be a flat surface or a curved surface, and a plate disposed on a rear surface of the display module, the plate including a first plate coupled to the first area and a second plate coupled to the second area. The first plate includes a first slit area including a plurality of first extensions extending toward the second plate and a plurality of first slits formed between the plurality of first extensions. The second plate includes a second slit area including a plurality of second extensions extending toward the first plate and a plurality of second slits formed between the plurality of second extensions. The electronic device is capable of entering a folded state in which the folding area is formed to be a curved surface and a flat state in which the folding area is formed to be a flat surface.

In accordance with another aspect of the disclosure, a display assembly is provided. The display assembly includes a display module including a cover layer that forms a surface of the display assembly, a panel layer disposed under the cover layer and including a pixel array, and a buffer layer disposed under the panel layer, a first plate disposed under the display module, and a second plate disposed under the display module and spaced apart from the first plate at a predetermined interval. The first plate includes a first coupled area coupled to a rear surface of the display module and a first uncoupled area that is not coupled to the rear surface of the display module and that extends from the first coupled area toward the second plate and has a plurality of first slits formed therein. The second plate includes a second coupled area coupled to the rear surface of the display module and a second uncoupled area that is not coupled to the rear surface of the display module and that extends from the second coupled area toward the first plate and has a plurality of second slits formed therein.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 9A and 9B are sectional views illustrating a slit area of the plate of the display module according to various embodiments of the disclosure.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
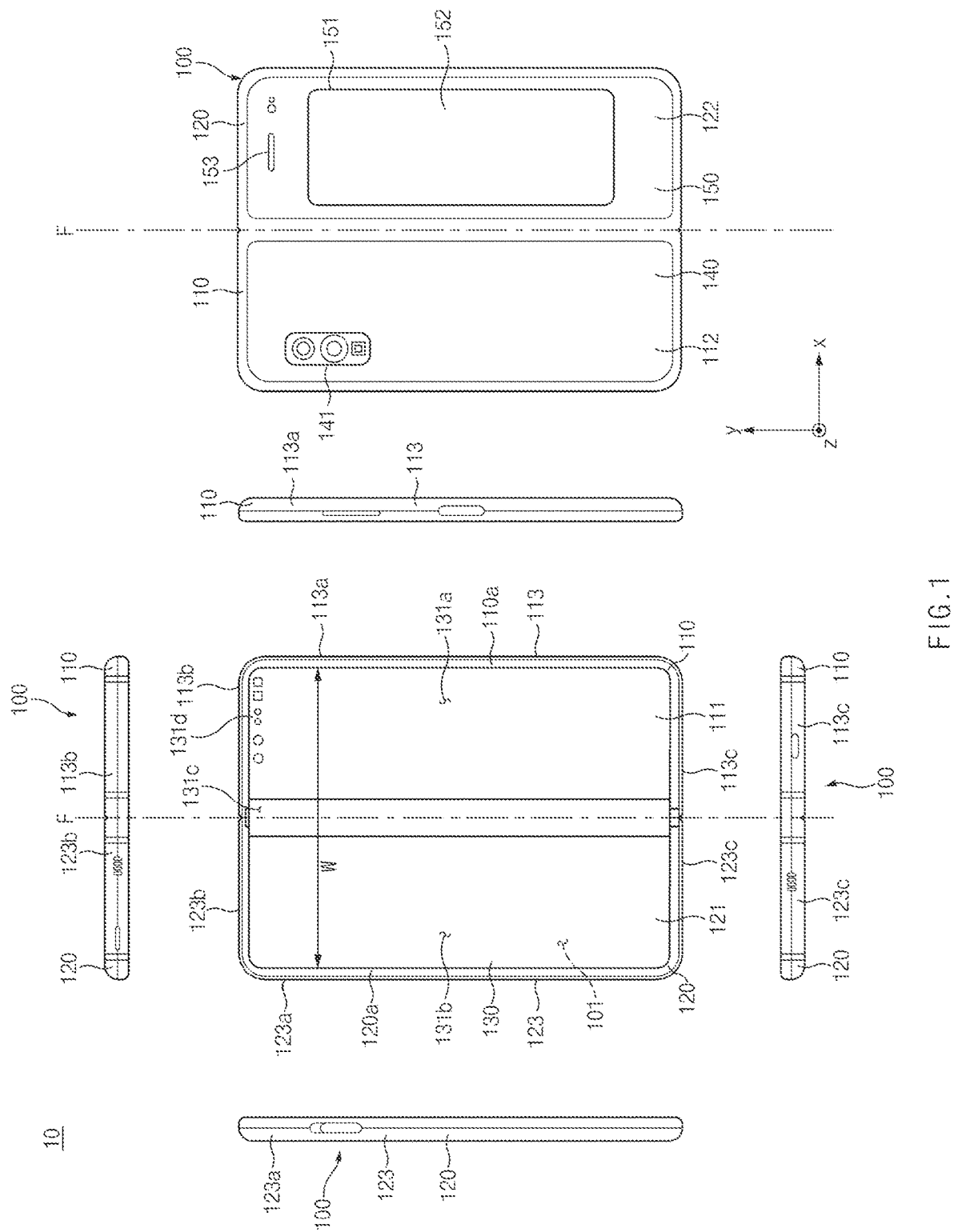
FIG. 1 is a view illustrating a flat state of an electronic device according to an embodiment of the disclosure.
Figure 2:
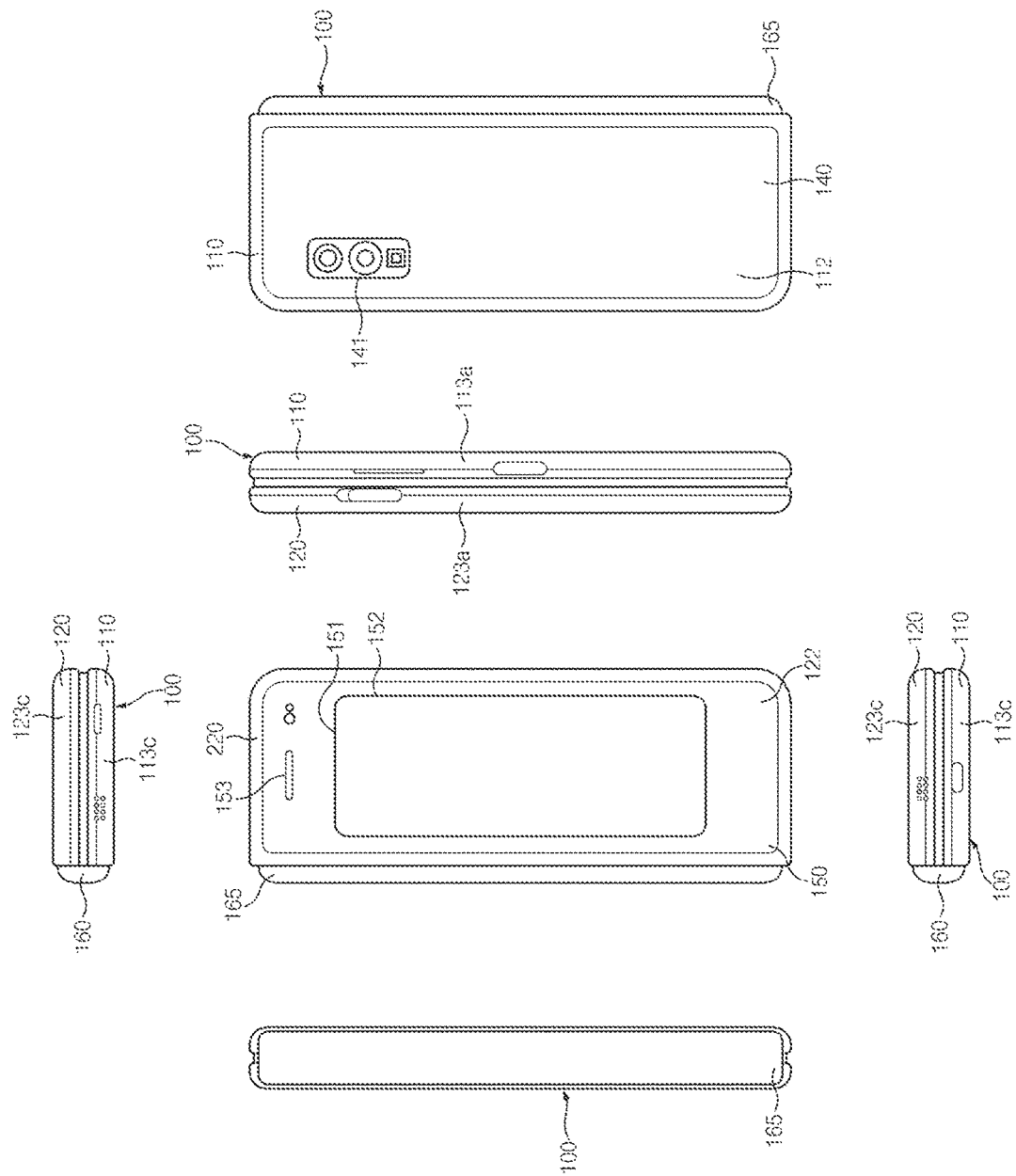
FIG. 2 is a view illustrating a folded state of the electronic device of FIG. 1 according to an embodiment of the disclosure.

FIG. 1 is a view illustrating a flat state of an electronic device according to an embodiment of the disclosure. FIG. 2 is a view illustrating a folded state of the electronic device of FIG. 1 according to an embodiment of the disclosure.

Referring to FIG. 1, the electronic device 100 may include a pair of housing structures 110 and 120 (e.g., foldable housing structures) that are coupled to pivot around a hinge structure (e.g., a hinge structure 164 of FIG. 3) so as to be folded relative to each other, a hinge cover (e.g., a hinge cover 165 of FIG. 2) that covers foldable portions of the pair of housing structures 110 and 120, and a display 130 (e.g., a flexible display or a foldable display) that is disposed in a space formed by the pair of housing structures 110 and 120. In this disclosure, a surface on which the display 130 is disposed may be defined as a front surface of the electronic device 100, and a surface opposite to the front surface may be defined as a rear surface of the electronic device 100. Furthermore, surfaces surrounding a space between the front surface and the rear surface may be defined as side surfaces of the electronic device 100.

The pair of housing structures 110 and 120 may include the first housing structure 110 including a sensor area 131d, the second housing structure 120, a first back cover 140, and a second back cover 150. The pair of housing structures 110 and 120 of the electronic device 100 are not limited to the form and the coupling illustrated in FIGS. 1 and 2 and may be implemented by a combination and/or coupling of other shapes or parts. For example, the first housing structure 110 and the first back cover 140 may be integrated with each other, and the second housing structure 120 and the second back cover 150 may be integrated with each other.

The first housing structure 110 and the second housing structure 120 may be disposed on opposite sides of a folding axis (an axis F) and may have shapes that are entirely symmetric to each other with respect to the folding axis (the axis F). The angle or distance that the first housing structure 110 and the second housing structure 120 form may vary depending on whether the electronic device 100 is in a flat state (or, a closing state), a folded state, or an intermediate state. In an embodiment, the first housing structure 110 and the second housing structure 120 may have mutually symmetrical shapes.

The first housing structure 110, in a flat state of the electronic device 100, may be connected to the hinge structure (e.g., the hinge structure 164 of FIG. 3) and may include a first surface 111 disposed to face toward the front surface of the electronic device 100, a second surface 112 facing away from the first surface 111, and a first side member 113 surrounding at least part of a space between the first surface 111 and the second surface 112. The first side member 113 may include a first side surface 113a disposed parallel to the folding axis (the axis F), a second side surface 113b extending from one end of the first side surface 113a in a direction perpendicular to the folding axis, and a third side surface 113c extending from an opposite end of the first side surface 113a in the direction perpendicular to the folding axis (the axis F).

The second housing structure 120, in the flat state of the electronic device 100, may be connected to the hinge structure (e.g., the hinge structure 164 of FIG. 3) and may include a third surface 121 disposed to face toward the front surface of the electronic device 100, a fourth surface 122 facing away from the third surface 121, and a second side member 123 surrounding at least part of a space between the third surface 121 and the fourth surface 122. The second side member 123 may include a fourth side surface 123a disposed parallel to the folding axis (the axis F), a fifth side surface 123b extending from one end of the fourth side surface 123a in the direction perpendicular to the folding axis (the axis F), and a sixth side surface 123c extending from an opposite end of the fourth side surface 123a in the direction perpendicular to the folding axis (the axis F). The third surface 121, in a folded state, may face the first surface 111.

The electronic device 100 may include a recess 101 formed to accommodate the display 130 through a structural shape coupling of the first housing structure 110 and the second housing structure 120. The recess 101 may have substantially the same size as the display 130.

The recess 101 may have a predetermined width W. The width W may be a distance measured from a first portion 110a of the first housing structure 110 to a second portion 120a of the second housing structure 120 in the direction perpendicular to the folding axis F. The recess 101 may have bilateral symmetry with respect to the folding axis F. For example, the distance between the first portion 110a and the folding axis F may be the same as the distance between the second portion 120a and the folding axis F. The recess 101 may have a bilaterally asymmetric shape with respect to the folding axis F. At least part of the first housing structure 110 and at least part of the second housing structure 120 may be formed of a metallic material or a non-metallic material that has a stiffness selected to support the display 130.

The sensor area 131d may be formed to have a predetermined area adjacent to one corner of the first housing structure 110. However, the arrangement, shape, or size of the sensor area 131d is not limited to the illustrated example. For example, the sensor area 131d may be provided in another corner of the first housing structure 110 or in any area between an upper corner and a lower corner of the first housing structure 110. In another embodiment, the sensor area 131d may be disposed in at least a partial area of the second housing structure 120.

The electronic device 100 may include parts that perform various functions and that are disposed to be visible from the front of the electronic device 100 though the sensor area 131d or through one or more openings formed in the sensor area 131d.

The sensor area 131d may include openings (e.g., a punch hole) formed through a part of a plurality of layers included in the display 130, and parts disposed in the openings. The parts may include, for example, at least one of a front camera device, a receiver, a proximity sensor, an illuminance sensor, an iris recognition sensor, an ultrasonic sensor, or an indicator.

The first back cover 140 may be disposed on the second surface 112 of the first housing structure 110 and may have a substantially rectangular periphery. At least part of the periphery may be surrounded by the first housing structure 110. Similarly, the second back cover 150 may be disposed on the fourth surface 122 of the second housing structure 120, and at least part of the periphery of the second back cover 150 may be surrounded by the second housing structure 120.

In the embodiment shown in FIG. 1, the first back cover 140 and the second back cover 150 may have substantially symmetrical shapes with respect to the folding axis (the axis F). In another embodiment, the first back cover 140 and the second back cover 150 may include various different shapes. In another embodiment, the first back cover 140 may be integrally formed with the first housing structure 110, and the second back cover 150 may be integrally formed with the second housing structure 120.

The first back cover 140, the second back cover 150, the first housing structure 110, and the second housing structure 120 may provide, through a mutually coupled structure, a space in which various parts (e.g., a printed circuit board, an antenna module, a sensor module, or a battery) of the electronic device 100 are disposed. One or more parts may be disposed, or visually exposed, on the rear surface of the electronic device 100. For example, one or more parts or sensors may be visually exposed through a first rear area 141 of the first back cover 140. The sensors may include a proximity sensor, a rear camera device, and/or a flash. At least part of a sub-display 152 may be visually exposed through a second rear area 151 of the second back cover 150. The electronic device 100 may include a speaker module 153 disposed through at least a partial area of the second back cover 150.

The display 130 may be disposed on the space formed by the pair of housing structures 110 and 120. For example, the display 130 may be mounted in the recess 101 formed by the pair of housing structures 110 and 120 and may be disposed to occupy substantially the entire front surface of the electronic device 100. Accordingly, the front surface of the electronic device 100 may include the display 130, and a partial area (e.g., a peripheral area) of the first housing structure 110 and a partial area (e.g., a peripheral area) of the second housing structure 120 that are adjacent to the display 130. The rear surface of the electronic device 100 may include the first back cover 140, a partial area (e.g., a peripheral area) of the first housing structure 110 that is adjacent to the first back cover 140, the second back cover 150, and a partial area (e.g., a peripheral area) of the second housing structure 120 that is adjacent to the second back cover 150.

The display 130 may refer to a display, at least a partial area of which is able to be deformed into a flat surface or a curved surface. In an embodiment, the display 130 may include a folding area 131c, a first area 131a disposed on one side of the folding area 131c (e.g., on a right side of the folding area 131c), and a second area 131b disposed on an opposite side of the folding area 131c (e.g., on a left side of the folding area 131c). For example, the first area 131a may be disposed on the first surface 111 of the first housing structure 110, and the second area 131b may be disposed on the third surface 121 of the second housing structure 120.

The division of the display 130 into the areas is illustrative, and the display 130 may be divided into a plurality of areas (e.g., four or more areas, or two areas) depending on the structure or function of the display 130. For example, in the embodiment illustrated in FIG. 1, the areas of the display 130 may be divided from each other by the folding area 131c or the folding axis (the axis F) that extends parallel to the y axis. However, in another embodiment, the display 130 may be divided into areas with respect to a different folding area (e.g., a folding area parallel to the x axis) or a different folding axis (e.g., a folding axis parallel to the x axis). The above-described division of the display 130 into the areas may be merely a physical division by the pair of housing structures 110 and 120 and the hinge structure (e.g., the hinge structure 164 of FIG. 3), and one full screen may be displayed on the display 130 substantially through the pair of housing structures 110 and 120 and the hinge structure (e.g., the hinge structure 164 of FIG. 3). The first area 131a and the second area 131b may have shapes that are entirely symmetric to each other with respect to the folding area 131c. However, unlike the second area 131b, the first area 131a may include a notch area (e.g., a notch area 133 of FIG. 3) that is cut depending on the presence of the sensor area 131d, but in the other area, the first area 131a may have a shape that is symmetric to the second area 131b. For example, the first area 131a and the second area 131b may include a portion having a symmetrical shape and a portion having an asymmetrical shape.

Figure 3:
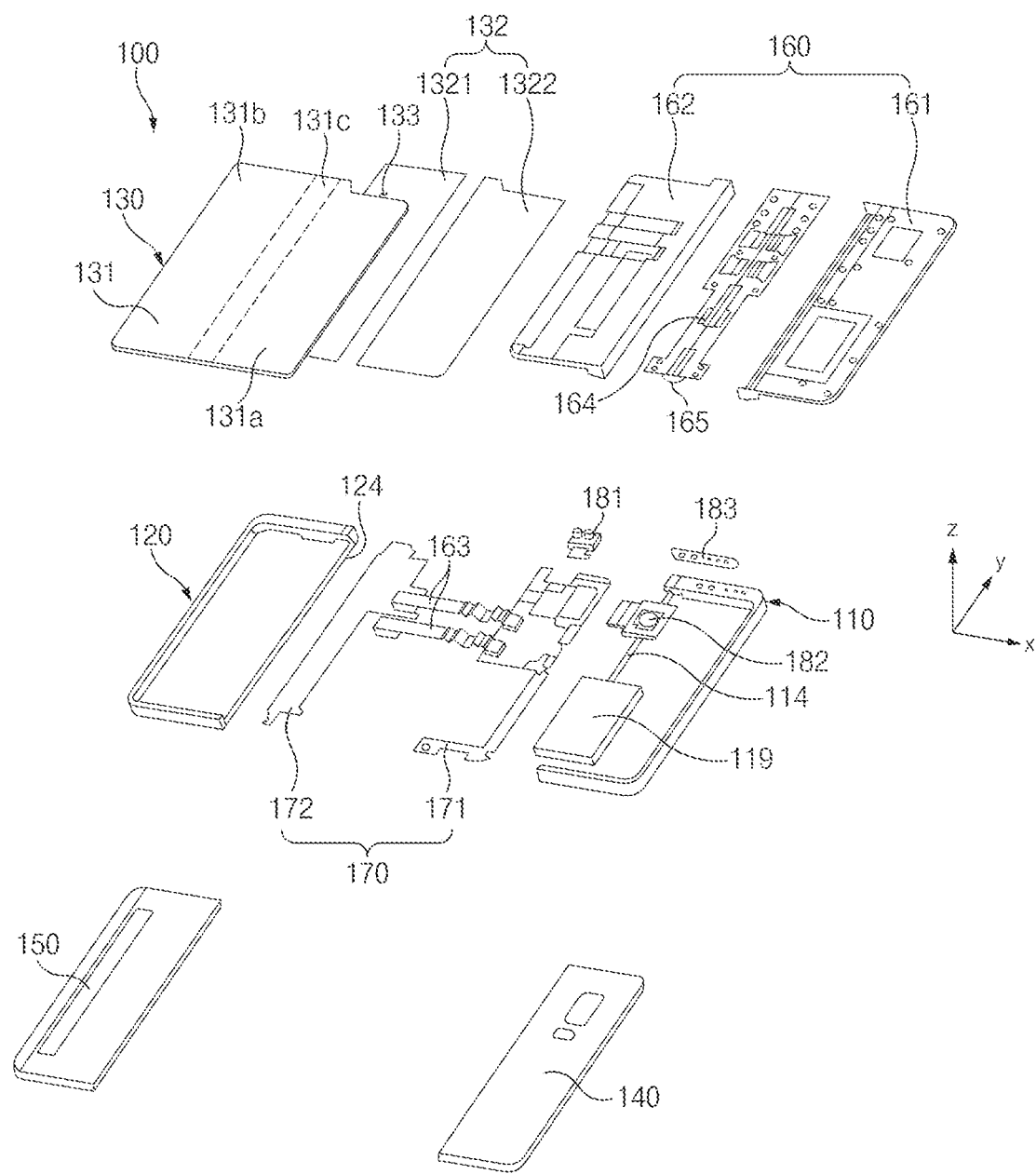
FIG. 3 is an exploded perspective view of the electronic device according to an embodiment of the disclosure.

Referring to FIG. 2, the hinge cover 165 may be disposed between the first housing structure 110 and the second housing structure 120 and may be configured to hide an internal part (e.g., the hinge structure 164 of FIG. 3). The hinge cover 165 may be hidden by a portion of the first housing structure 110 and a portion of the second housing structure 120, or may be exposed to the outside, depending on an operational state (a flat state or a folded state) of the electronic device 100.

For example, when the electronic device 100 is in a flat state as illustrated in FIG. 1, the hinge cover 165 may not be exposed by being hidden by the first housing structure 110 and the second housing structure 120. When the electronic device 100 is in a folded state (e.g., a fully folded state) as illustrated in FIG. 2, the hinge cover 165 may be exposed to the outside from between the first housing structure 110 and the second housing structure 120. When the electronic device 100 is in an intermediate state in which the first housing structure 110 and the second housing structure 120 are folded with a certain angle, the hinge cover 165 may be at least partially exposed to the outside of the electronic device 100 from between the first housing structure 110 and the second housing structure 120. In this case, the exposed area may be smaller than that in the fully folded state. In an embodiment, the hinge cover 165 may include a curved surface.

Hereinafter, operations of the first housing structure 110 and the second housing structure 120 and the areas of the display 130 depending on an operational state (e.g., a flat state or a folded state) of the electronic device 10 will be described.

In an embodiment, when the electronic device 100 is in a flat state (e.g., the state of FIG. 1), the first housing structure 110 and the second housing structure 120 may form an angle of 180 degrees therebetween, and the first area 131*a* and the second area 131*b* of the display 130 may be disposed to face the same direction. Furthermore, the folding area 131*c*, together with the first area 131*a* and the second area 131*b*, may form the same plane. In another embodiment, when the electronic device 100 is in the flat state, the first housing structure 110 and the second housing structure 120 may rotate relative to each other through an angle of 360 degrees and may be oppositely folded such that the second surface 112 and the fourth surface 122 face each other.

In an embodiment, when the electronic device 100 is in a folded state (e.g., the state of FIG. 2), the first housing structure 110 and the second housing structure 120 may be disposed to face each other. The first area 131*a* and the second area 131*b* of the display 130 may face each other while forming a narrow angle (e.g., between 0 degrees and 10 degrees). At least part of the folding area 131*c* may be formed to be a curved surface having a predetermined curvature.

In an embodiment, when the electronic device 100 is in an intermediate state, the first housing structure 110 and the second housing structure 120 may be disposed at a certain angle. The first area 131*a* and the second area 131*b* of the display 130 may form an angle that is larger than that in the folded state and is smaller than that in the flat state. At least part of the folding area 131*c* may be formed to be a curved surface having a predetermined curvature. In this case, the curvature may be smaller than that in the folded state.

FIG. 3 is an exploded perspective view of the electronic device according to various embodiments of the disclosure.

Referring to FIG. 3, the electronic device 100 may include the display 130, a support member assembly 160, at least one printed circuit board 170, the first housing structure 110, the second housing structure 120, the first back cover 140, and the second back cover 150. In this disclosure, the display unit 130 may be referred to as a display module or a display assembly.

The display 130 may include a display panel 131 (e.g., a flexible display panel) and at least one plate 132 or layer on which the display panel 131 is mounted. In an embodiment, the plate 132 may be disposed between the display panel 131 and the support member assembly 160. The display panel 131 may be disposed on at least part of one surface of the plate 132. The plate 132 may include a first plate 1321 and a second plate 1322 divided from each other with respect to the hinge structure 164. The plate 132 may include at least one member that cannot be folded together when the first housing structure 110 and the second housing structure 120 are folded and/or unfolded with respect to the hinge structure 164. The plate 132 may include at least one subsidiary material layer (e.g., graphite member) and/or conductive plate (e.g., Cu sheet) that is disposed on a rear surface of the display panel 131. In an embodiment, the plate 132 may be formed in a shape corresponding to the display panel 131. For example, a partial area of the first plate 1321 may be formed in a shape corresponding to the notch area 133 of the display panel 131.

Figure 7:
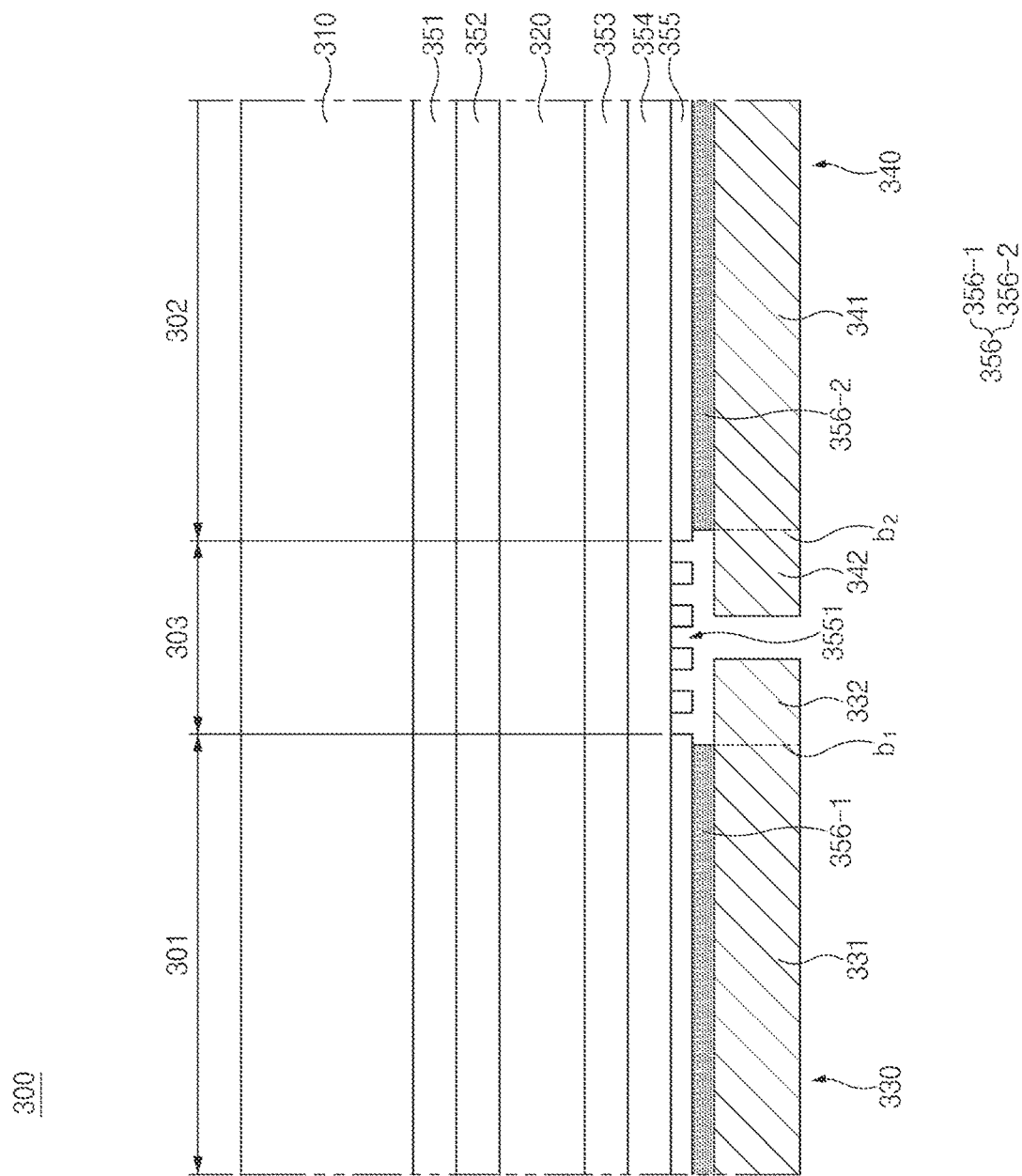
FIG. 7 is a sectional view illustrating a flat state of the display module according to an embodiment of the disclosure.

The display 130 may further include a metal plate (e.g., 355 of FIG. 7). The metal plate may include a third area that corresponds to the first area 131*a* and the second area 131*b* of the display 130 and a fourth area that corresponds to the folding area 131*c* of the display 130. A lattice structure (e.g., a lattice structure 3551 of FIG. 7) may be formed in the fourth area. The lattice structure (e.g., the lattice structure 3551 of FIG. 7) may include a plurality of slits extending in the direction of the folding axis F. The fourth area, together with the folding area 131*c* of the display 130, may be deformed into a flat surface or a curved surface by the lattice structure.

The support member assembly 160 may include a first support member 161, a second support member 162, the hinge structure 164 disposed between the first support member 161 and the second support member 162, the hinge cover 165 covering the hinge structure 164 when the hinge structure 164 is viewed from the outside, and at least one wiring member 163 (e.g., a flexible printed circuit board (FPCB)) across the first support member 161 and the second support member 162.

The support member assembly 160 may be disposed between the plate 132 and the at least one printed circuit board 170. For example, the first support member 161 may be disposed between the first area 131*a* of the display 130 and a first printed circuit board 171. The second support member 162 may be disposed between the second area 131*b* of the display 130 and a second printed circuit board 172.

The wiring member 163 and at least part of the hinge structure 164 may be disposed inside the support member assembly 160. The wiring member 163 may be disposed in a direction (e.g., the x-axis direction) across the first support member 161 and the second support member 162. The wiring member 163 may be disposed in a direction (e.g., the x-axis direction) perpendicular to the folding axis of the folding area 131*c* (e.g., the y-axis or the folding axis F of FIG. 1).

The at least one printed circuit board 170, as mentioned above, may include the first printed circuit board 171 disposed on one side of the first support member 161 and the second printed circuit board 172 disposed on one side of the second support member 162. The first printed circuit board 171 and the second printed circuit board 172 may be disposed in a space formed by the support member assembly 160, the first housing structure 110, the second housing structure 120, the first back cover 140, and the second back cover 150. Parts for implementing various functions of the electronic device 100 may be mounted on the first printed circuit board 171 and the second printed circuit board 172.

The first housing structure 110 may contain the first printed circuit board 171, a battery 119, at least one sensor module 181, or at least one camera module 182 that is disposed in a space formed through the first support member 161. The first housing structure 110 may include a glass window 183 that is disposed in a position corresponding to the notch area 133 of the display 130 and that protects the at least one sensor module 181 and the at least one camera module 182. The second housing structure 120 may contain the second printed circuit board 172 disposed in a space formed through the second support member 162. The first housing structure 110 and the first support member 161 may be integrated with each other. The second housing structure 120 and the second support member 162 may also be integrated with each other.

The first housing structure 110 may include a first rotation support surface 114, and the second housing structure 120 may include a second rotation support surface 124 corresponding to the first rotation support surface 114. The first rotation support surface 114 and the second rotation support surface 124 may include a curved surface corresponding to the curved surface included in the hinge cover 165.

When the electronic device 100 is in a flat state (e.g., the state of FIG. 1), the first rotation support surface 114 and the second rotation support surface 124 may cover the hinge cover 165 such that the hinge cover 165 is not exposed, or is minimally exposed, on the rear surface of the electronic device 100. When the electronic device 100 is in a folded state (e.g., the state of FIG. 2), the first rotation support surface 114 and the second rotation support surface 124 may rotate along the curved surface included in the hinge cover 165 such that the hinge cover 165 is maximally exposed on the rear surface of the electronic device 100.

Figure 4A:
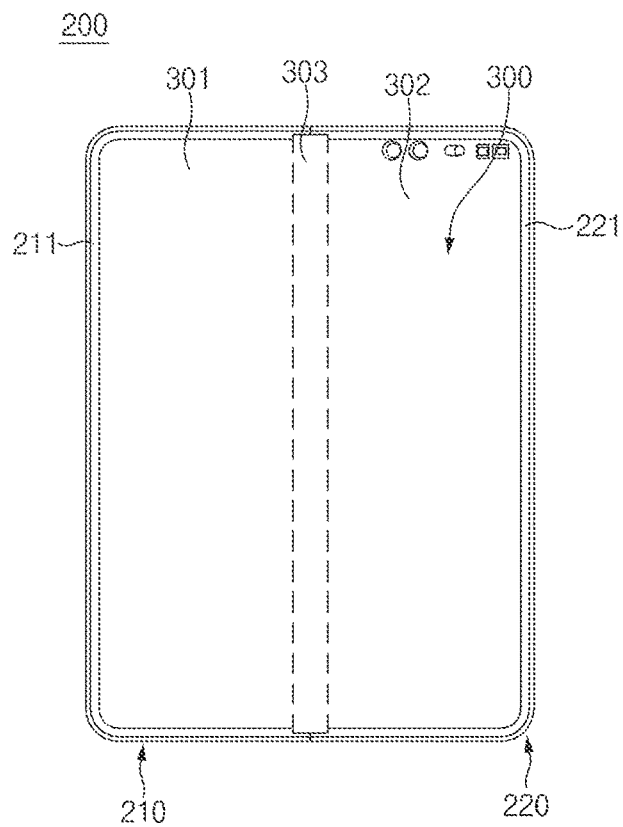
FIGS. 4A and 4B are views illustrating a flat state and a folded state of an electronic device according to various embodiments of the disclosure.
Figure 4B:
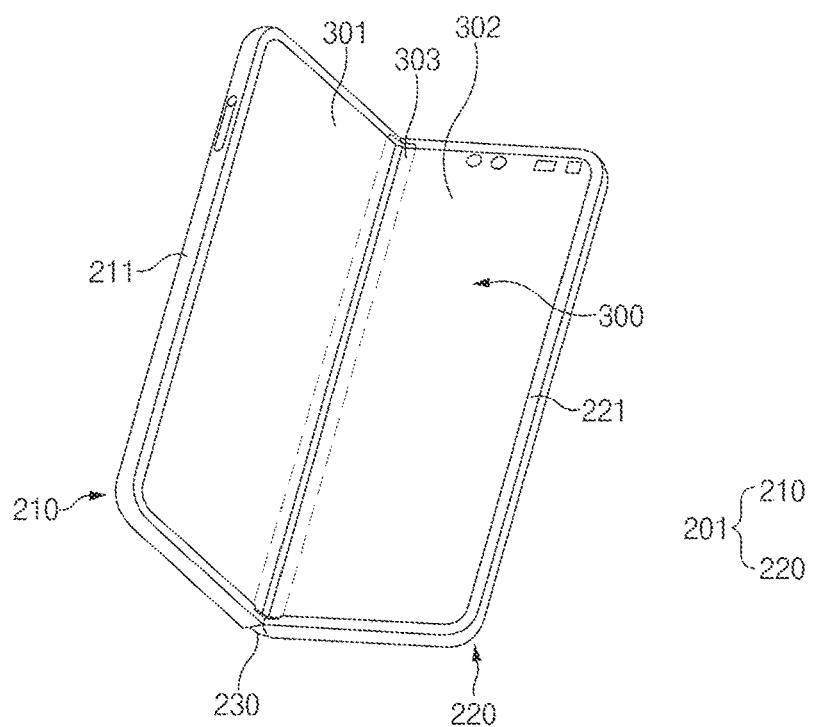

FIGS. 4A and 4B are views illustrating a flat state and a folded state of an electronic device according to various embodiments of the disclosure.

The electronic device 200 disclosed herein may include the flat state (FIG. 4A) and the folded state (FIG. 4B).

Referring to FIGS. 4A and 4B, a display module 300 may include a first area 301, a second area 302, and a folding area 303 formed between the first area 301 and the second area 302.

The first area 301 may be formed to be a flat surface when the electronic device 200 is in the folded state and the flat state. The second area 302 may be formed to be a flat surface when the electronic device 200 is in the folded state and the flat state. The folding area 303 may be formed to be a flat surface when the electronic device 200 is in the flat state and may be formed to be a curved surface having a predetermined curvature when the electronic device 200 is in the folded state.

In the embodiment illustrated in FIGS. 4A and 4B, the flat state may include a state in which the first area 301 and the second area 302 face substantially the same direction. The flat state may include a state in which normal vectors of the first area 301 and the second area 302 are parallel to each other. The flat state may include a state in which the folding area 303 is formed to be a flat surface.

The folded state may include a state in which the first area 301 and the second area 302 form a certain angle therebetween. The folded state may include a state in which the normal vectors of the first area 301 and the second area 302 form a certain angle therebetween. The folded state may include a state in which the folding area 303 is formed to be a curved surface.

In the embodiment illustrated in FIGS. 4A and 4B, the electronic device 200 may include a housing structure 201 that includes a first housing 210 and a second housing 220. The first housing 210 may be formed to surround at least part of the periphery of the first area 301 and at least part of the periphery of the folding area 303. The first housing 210 may include a first bracket (e.g., 161 of FIG. 3) on which the first area 301 of the display module 300 is seated and a first sidewall 211 that surrounds the at least part of the periphery of the first area 301. The second housing 220 may be formed to surround at least part of the periphery of the second area 302 and at least part of the periphery of the folding area 303. The second housing 220 may include a second bracket (e.g., 162 of FIG. 3) on which the second area 302 of the display module 300 is seated and a second sidewall 221 that surrounds the at least part of the periphery of the second area 302.

The housing structure 201 may further include a hinge structure 230 formed between the first housing 210 and the second housing 220. In the folded state, the hinge structure 230 may be exposed on the exterior of the electronic device 200. In the flat state, the hinge structure 230 may be hidden by the first housing 210 and the second housing 220.

Figure 5:
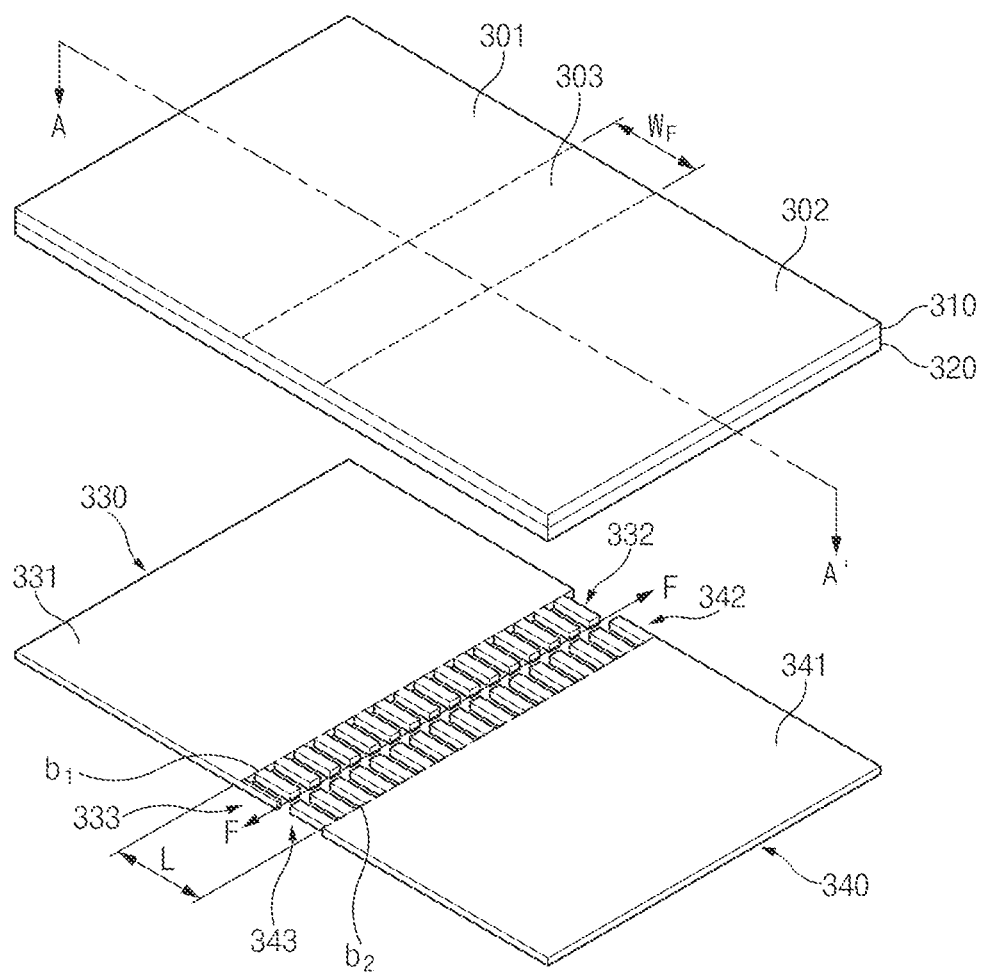
FIG. 5 is an exploded perspective view of a display module of the electronic device according to an embodiment of the disclosure.

FIG. 5 is an exploded perspective view of the display module of the electronic device according to an embodiment of the disclosure. FIG. 5 may be understood as an exploded perspective view of the display module in a case where the electronic device is in a flat state.

Referring to FIG. 5, the display module 300 may include the first area 301 formed to be a flat surface, the second area 302 formed to be a flat surface, and the folding area 303 formed between the first area 301 and the second area 302 and deformable into a curved surface or a flat surface. A plurality of layers (e.g., a cover layer 310 and a panel layer 320) that form the display module 300 may be included in the first area 301, the second area 302, and the folding area 303. The display module 300 may include a folded state in which the folding area 303 is formed to be a curved surface and a flat state in which the folding area 303 is formed to be a flat surface.

The display module 300 may further include a plurality of layers. For example, the display module 300 may further include a polyimide (PI) substrate disposed between the panel layer 320 and plates 330 and 340 and a metal plate (e.g., the metal plate 355 of FIG. 7) disposed between the PI substrate and the plates 330 and 340. The PI substrate may include wires electrically connected to light emitting elements included in the panel layer 320. The metal plate (e.g., the metal plate 355 of FIG. 7) may include a lattice structure (e.g., the lattice structure 3551 of FIG. 7) that corresponds to the folding area 303 of the display module 300. Each of the plurality of layers may be coupled with an adjacent layer by a pressure sensitive adhesive (PSA).

In the embodiment illustrated in FIG. 5, the display module 300 may include the cover layer 310 that forms a surface of the display module 300, and the panel layer 320 disposed under the cover layer 310.

The cover layer 310 may form a surface of the display module 300. In the flat state, the cover layer 310 may form a surface of the electronic device 200. In the folded state, a partial area of the cover layer 310 that is included in the folding area 303 may be formed to be a curved surface. In the folded state, the cover layer 310 may be located inside the electronic device 200. The cover layer 310 may be formed to be transparent such that a pixel array of the panel layer 320 disposed under the cover layer 310 is visible from the outside. The cover layer 310 may be formed of a glass, plastic, or polymer material. At least part (e.g., an area included in the folding area 303) of the cover layer 310 may be formed to be flexible.

The panel layer 320 may be disposed between the cover layer 310 and the plates 330 and 340. The panel layer 320 may include the pixel array (not illustrated) that includes the plurality of light emitting elements. In the flat state, the panel layer 320 may represent visual information on the surface of the electronic device 200. The first plate 330 and the second plate 340 may be coupled to the bottom of the panel layer 320. The first plate 330 may be coupled to a portion of the panel layer 320, and the second plate 340 may be coupled to another portion of the panel layer 320. The first plate 330 and the second plate 340 may be attached to the panel layer 320 by an adhesive material.

The panel layer 320 may include a plurality of layers (not illustrated). The panel layer 320 may include the pixel array (not illustrated) that includes the plurality of light emitting elements (e.g., OLED elements), a wiring layer (not illustrated) that includes a plurality of thin film transistors, and a thin film encapsulation film (not illustrated). The thin film encapsulation film may protect the light emitting elements included in the pixel array. For example, the thin film encapsulation film may protect the plurality of light emitting elements from moisture or oxygen by forming a plurality of organic layers and/or inorganic layers.

The first plate 330 and the second plate 340 may be coupled to a rear surface of the display module 300.

In the embodiment illustrated in FIG. 5, the first plate 330 may include a first attached area 331, a first unattached area 332 extending from the first attached area 331 toward the second plate 340, and a first slit area 333 formed in an end portion of the first unattached area 332.

The first plate 330 may be formed to be a flat surface that faces substantially the same direction as the second plate 340. The first plate 330 may be formed of a metallic material. The first plate 330 may support the first area 301 of the display module 300 such that the first area 301 of the display module 300 remains flat.

The first attached area 331 may be attached to part of a rear surface of the panel layer 320. The first attached area 331 may be coupled to part of the first area 301 of the display module 300. The first attached area 331 may be attached to part of the rear surface of the panel layer 320 that is included in the first area 301 of the display module 300. The first attached area 331 may support the first area 301 of the display module 300 such that the first area 301 of the display module 300 remains flat.

The first unattached area 332 may extend from the first attached area 331 in a direction perpendicular to a folding axis F. The first unattached area 332 may be an area that is not attached to the rear surface of the panel layer 320 and that extends from the first attached area 331. A portion of the first unattached area 332 may be formed in a position corresponding to the first area 301 of the display module 300, and the remaining portion of the first unattached area 332 may be formed in a position corresponding to the folding area 303 of the display module 300.

The first attached area 331 and the first unattached area 332 may form a first boundary b1. The first boundary b1 may be formed to be a straight line or a curved line. The first boundary b1 may be defined by an adhesive layer (not illustrated) that bonds the panel layer 320 and the first plate 330. An area of the first plate 330 that is close to the folding axis F with respect to the first boundary b1 may be defined as the first unattached area 332 not coupled to the adhesive layer, and the remaining area of the first plate 330 may be defined as the first attached area 331 coupled to the adhesive layer. The first boundary b1 may be spaced apart from a second boundary b2 by a predetermined distance L. The predetermined distance L may be smaller than the width WF of the folding area 303. Accordingly, in the folded state, the first unattached area 332 may remain flat even when the folding area 303 is formed to be a curved surface.

The first slit area 333 may be formed in at least part of the first unattached area 332. For example, the first slit area 333 may be formed from the first boundary b1. Alternatively, the first slit area 333 may be formed from a position spaced apart from the first boundary b1. In the illustrated embodiment, the first slit area 333 may be formed in an end portion of the first unattached area 332. The first slit area 333 may include a plurality of extensions extending in the direction perpendicular to the folding axis F and slits formed between the plurality of extensions. At least part of the first slit area 333 may be formed in an area corresponding to the folding area 303 of the display module 300. In the flat state, the first slit area 333 may face the folding area 303 of the display module 300.

In the embodiment illustrated in FIG. 5, the second plate 340 may include a second attached area 341, a second unattached area 342 extending from the second attached area 341 toward the first plate 330, and a second slit area 343 formed in an end portion of the second unattached area 342.

The second plate 340 may be formed to be a flat surface that faces substantially the same direction as the first plate 330. The second plate 340 may be formed of a metallic material. The second plate 340 may support the second area 302 of the display module 300 such that the second area 302 of the display module 300 remains flat.

The second attached area 341 may be coupled to part of the rear surface of the panel layer 320. The second attached area 341 may be coupled to part of the second area 302 of the display module 300. The second attached area 341 may be attached to part of the rear surface of the panel layer 320 that is included in the second area 302 of the display module 300. The second attached area 341 may support the second area 302 of the display module 300 such that the second area 302 of the display module 300 remains flat.

The second unattached area 342 may extend from the second attached area 341 in a direction perpendicular to the folding axis F. The second unattached area 342 may be an area that is not attached to the rear surface of the panel layer 320 and that extends from the second attached area 341. A portion of the second unattached area 342 may be formed in a position corresponding to the second area 302 of the display module 300, and the remaining portion of the second unattached area 342 may be formed in a position corresponding to the folding area 303 of the display module 300.

The second attached area 341 and the second unattached area 342 may form the second boundary b2. The second boundary b2 may be formed to be a straight line or a curved line. The second boundary b2 may be defined by an adhesive layer (not illustrated) that bonds the panel layer 320 and the second plate 340. An area of the second plate 340 that is close to the folding axis F with respect to the second boundary b2 may be defined as the second unattached area 342 not coupled to the adhesive layer, and the remaining area of the second plate 340 may be defined as the second attached area 341 coupled to the adhesive layer. The second boundary b2 may be spaced apart from the first boundary b1 by the predetermined distance L. The predetermined distance L may be smaller than the width WF of the folding area 303. Accordingly, in the folded state, the second unattached area 342 may remain flat even when the folding area 303 is formed to be a curved surface.

The second slit area 343 may be formed in at least part of the second unattached area 342. For example, the second slit area 343 may be formed from the second boundary b2. Alternatively, the second slit area 343 may be formed from a position spaced apart from the second boundary b2.

The second slit area 343 may be formed in an end portion of the second unattached area 342. The second slit area 343 may include a plurality of extensions extending in the direction perpendicular to the folding axis F and slits formed between the plurality of extensions. At least part of the second slit area 343 may be formed in an area corresponding to the folding area 303 of the display module 300. In the flat state, the second slit area 343 may face the folding area 303 of the display module 300.

Figure 6:
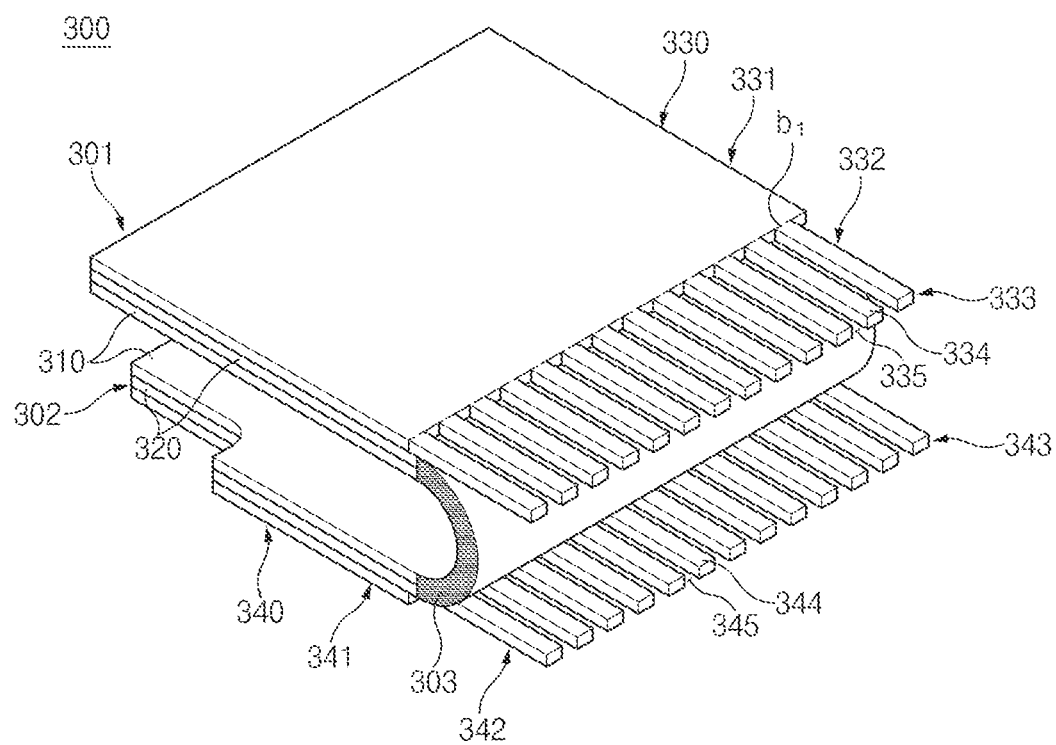
FIG. 6 is a perspective view illustrating a folded state of the display module according to an embodiment of the disclosure.

FIG. 6 is a perspective view illustrating a folded state of the display module according to an embodiment of the disclosure.

Referring to FIG. 6, in the folded state, the folding area 303 of the display module 300 may be formed to be a curved surface. The first area 301 and the second area 302 of the display module 300 may be formed to be flat surfaces extending from end portions of the folding area 303. In the folded state, the first area 301 and the second area 302 may face each other with the folding axis F therebetween.

In the folded state, the first plate 330 may be formed to be a flat surface. In the folded state, the first plate 330 may be formed to be a flat surface even when the display module 300 is folded. In the folded state, the first plate 330 may face a different direction from the second plate 340. The first plate 330 may face an opposite direction to the second plate 340, but is not necessarily limited thereto.

The first attached area 331 of the first plate 330 may be attached to the first area 301 of the display module 300 by an adhesive layer (not illustrated). The first attached area 331 of the first plate 330 may be formed to be a flat surface that faces the same direction as the first area 301. The first unattached area 332 of the first plate 330 may be formed to be a flat surface that extends from the first attached area 331. The first unattached area 332 may extend from the first attached area 331 in the direction of a tangential surface of the folding area 303. The first slit area 333 may be disposed such that first extensions 334 extend in the direction perpendicular to the folding axis F. The first slit area 333 may be disposed such that the first extensions 334 form a zigzag form with second extensions 344 of the second slit area 343.

In the folded state, the second plate 340 may be formed to be a flat surface. In the folded state, the second plate 340 may be formed to be a flat surface even when the display module 300 is folded. In the folded state, the second plate 340 may face a different direction from the first plate 330. The second plate 340 may face the opposite direction to the first plate 330, but is not necessarily limited thereto.

The second attached area 341 of the second plate 340 may be attached to the second area 302 of the display module 300 by an adhesive layer. The second attached area 341 of the second plate 340 may be formed to be a flat surface that faces the same direction as the second area 302. The second unattached area 342 of the second plate 340 may be formed to be a flat surface that extends from the second attached area 341. The second unattached area 342 may extend from the second attached area 341 in the direction of a tangential surface of the folding area 303. The second slit area 343 may be disposed such that second extensions 344 extend in the direction perpendicular to the folding axis F. The second slit area 343 may be disposed such that the second extensions 344 form a zigzag form with the first extensions 334 of the first slit area 333.

FIG. 7 is a sectional view illustrating a flat state of the display module according to an embodiment of the disclosure.

Referring to FIG. 7, the display module 300 may further include a plurality of layers, in addition to the cover layer 310 and the panel layer 320 described above. The plurality of layers may include a polarization layer 351, a touch sensor layer 352, and embo layer 353, a heat dissipation layer 354, and the metal plate 355. The polarization layer 351 and the touch sensor layer 352 may form part of the panel layer 320.

The polarization layer 351 and the touch sensor layer 352 may be disposed between the cover layer 310 and the panel layer 320. The embo layer 353 may be a layer having an embossing pattern formed thereon and may absorb external shock applied to the display module 300. The metal plate 355 may be formed of a metallic material. The metal plate 355 may include the lattice structure 3551. The lattice structure 3551 may include a plurality of openings extending in the direction of the folding axis F. Accordingly, the metal plate 355 may be bent depending on a change of state of the display module 300.

The display module 300 may further include an adhesive layer 356. The adhesive layer 356 may be disposed on the rear surface of the display module 300. The adhesive layer 356 may include a first adhesive area 356-1 that attaches the first attached area 331 of the first plate 330 to part of the first area 301 of the display module 300 and a second adhesive area 356-2 that attaches the second attached area 341 of the second plate 340 to the second area 302 of the display module 300. In various embodiments, the first adhesive area 356-1 and the second adhesive area 356-2 may be spaced apart from each other by a distance greater than at least the width of the folding area 303. That is, the adhesive layer 356 may not be formed on the folding area 303 of the display module 300.

The first adhesive area 356-1 of the adhesive layer 356 may form the first boundary b1. That is, the first attached area 331 and the first unattached area 332 of the first plate 330 may be defined by the first adhesive area 356-1.

The second adhesive area 356-2 of the adhesive layer 356 may form the second boundary b2. The second attached area 341 and the second unattached area 342 of the second plate 340 may be defined by the second adhesive area 356-2.

The first boundary b1 and the second boundary b2 may be spaced apart from each other by a distance greater than the width of the folding area 303. The first boundary b1 may be included in the first area 301 of the display module 300, and the second boundary b2 may be included in the second area 302 of the display module 300.

Figure 8:
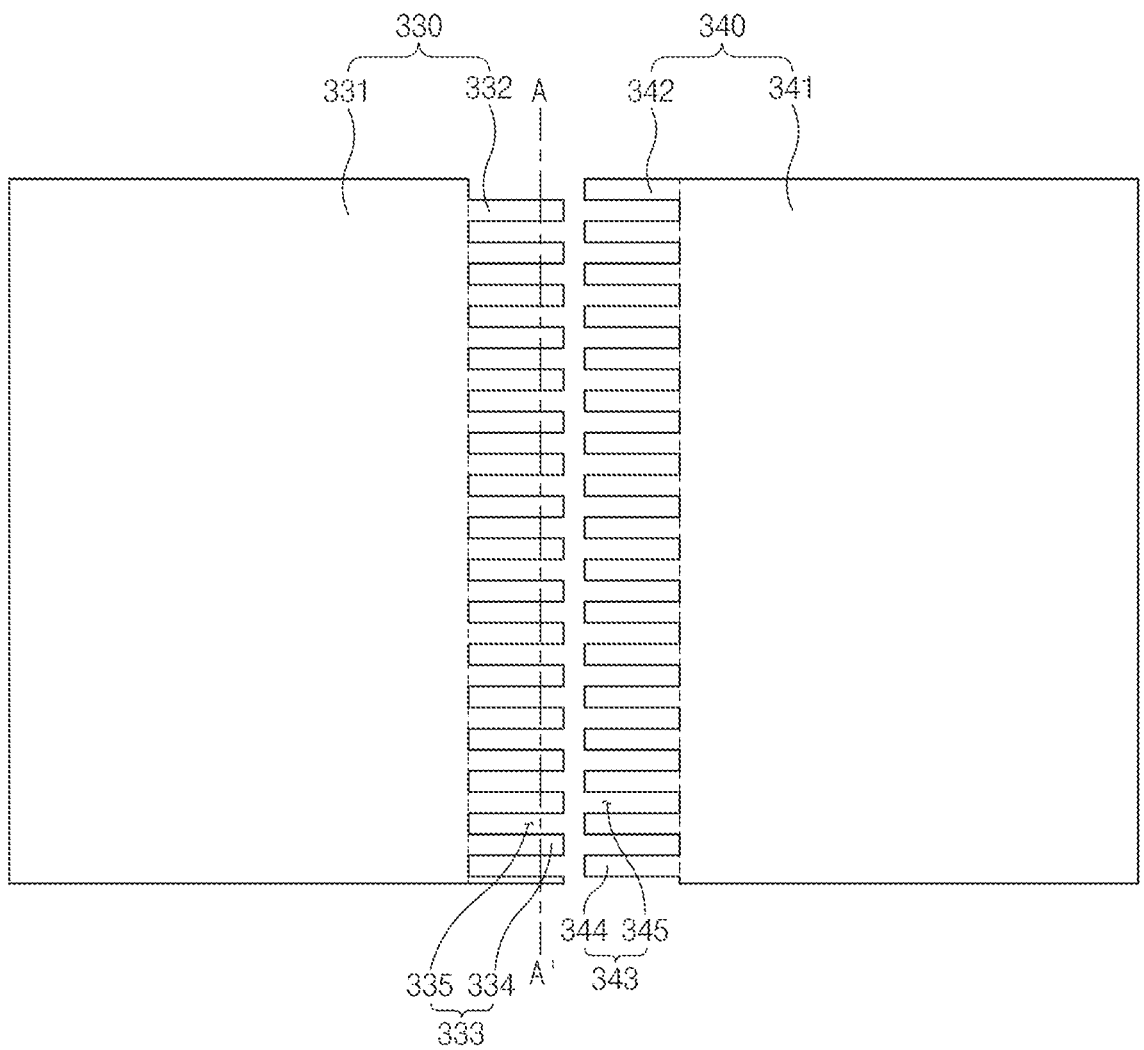
FIG. 8 is a plan view illustrating a plate of the display module according to an embodiment of the disclosure.

FIG. 8 is a plan view illustrating the plate of the display module according to an embodiment of the disclosure.

Referring to FIG. 8, the first plate 330 may include the first attached area 331, the first unattached area 332 extending from the first attached area 331, and the first slit area 333 formed in the end portion of the first unattached area 332. The first unattached area 332 may extend from the first attached area 331 in the direction perpendicular to the folding axis F.

The first slit area 333 may include the first extensions 334 extending toward the second plate 340 and a plurality of first slits 335 formed between the first extensions 334. The first extensions 334 may extend in the direction perpendicular to the folding axis F. The first extensions 334 may extend in the opposite direction to the direction in which the second extensions 344 extend. The first slit area 333 may be disposed in zigzags relative to the second slit area 343. For example, the first extensions 334 may extend toward second slits 345 included in the second slit area 343. The first slits 335 may be formed in positions corresponding to the second extensions 344 included in the second slit area 343. In various embodiments, the first slit area 333 and the second slit area 343 are not necessarily limited to being disposed in zigzags.

The second plate 340 may include the second attached area 341, the second unattached area 342 extending from the second attached area 341, and the second slit area 343 formed in the end portion of the second unattached area 342. The second unattached area 342 may extend from the second attached area 341 in the direction perpendicular to the folding axis F.

The second slit area 343 may include the plurality of second extensions 344 extending toward the first plate 330 and the plurality of second slits 345 formed between the second extensions 344. The second extensions 344 may extend in the direction perpendicular to the folding axis F. The second extensions 344 may extend in the opposite direction to the direction in which the first extensions 334 extend. The second slit area 343 may be disposed in zigzags relative to the first slit area 333. For example, the second extensions 344 may extend toward the first slits 335 included in the first slit area 333. The second slits 345 may be formed in positions corresponding to the first extensions 334 included in the first slit area 333. In various embodiments, the second slit area 343 and the first slit area 333 are not necessarily limited to being disposed in zigzags.

FIGS. 9A and 9B are sectional views illustrating a slit area of the plate of the display module according to various embodiments of the disclosure. FIGS. 9A and 9B are sectional views taken along line A-A' illustrated in FIG. 8.

Referring to FIGS. 9A and 9B, the slit area 400 may include an upper surface 401 facing toward a rear surface of a display module (e.g., the display module 300 of FIG. 5) and a lower surface 402 opposite to the upper surface 401. The upper surface 401 and the lower surface 402 may be formed by a plurality of extensions 411 and 421 included in the slit area 400.

The slit area 400 may include the plurality of extensions 411 and 421 and a plurality of slits 412 and 422 formed between the plurality of extensions 411 and 421. The plurality of extensions 411 and 421 may be formed between the plurality of slits 412 and 422. The plurality of extensions 411 and 421 may be spaced apart from each other at predetermined intervals d. Each of the plurality of slits 412 and 422 may be formed by extensions adjacent thereto. The slits 412 and 422 may include openings formed through the upper surface 401 and the lower surface 402.

The predetermined intervals d may be formed to be sufficiently small such that in a flat state, the slit area 400 supports a folding area of the display module to allow the folding area to remain flat. Furthermore, the predetermined intervals d may be formed to be sufficiently large to make it difficult for foreign matter to be located between the slit area 400 and the display module (e.g., the display module 300 of FIG. 5). For example, the foreign matter may fall through between the slits 412 and 422 (e.g., the spaces between the extensions 411 and 421) of the slit area 400. That is, the predetermined intervals d may be determined in consideration of an effect of the foreign matter and surface quality of the folding area.

The predetermined intervals d between the plurality of extensions 411 and 421 may range from 0.2 mm to 1.5 mm.

Referring to FIG. 6 together, in a folded state, the rear surface of the display module 300 may be exposed to the outside (e.g., to the interior space of the housing of the electronic device 200). The rear surface of the display module 300 may be exposed to foreign matter. In a state in which the foreign matter is located on the rear surface of the display module 300, when the display module 300 is changed to a flat state, the foreign matter may be located between the rear surface of the display module 300 and the plate (e.g., the first slit area 333 and the second slit area 343 of FIG. 6) and may affect other layers (e.g., the cover layer 310 and the panel layer 320) included in the display module 300. For example, the foreign matter may affect the flatness of other layers. The foreign matter may form a protruding mark or a stabbed mark on the cover layer 310.

The extensions 411 and 421 of the slit area 400 may be formed in various shapes. For example, the extensions 411 and 421 of the slit area 400 may be formed in various polygonal shapes such as a rectangular shape, a square shape, and a trapezoidal shape.

Referring to FIG. 9A, the extensions 411 may be formed in a rectangular shape. Each of the extensions 411 may include a first surface 411-1 that forms part of the upper surface 401 of the slit area 400 and a second surface 411-2 that forms part of the lower surface 402 of the slit area 400. The first surface 411-1 and the second surface 411-2 of the extension 411 may have substantially the same width W. Here, the width W may be a length measured in a direction parallel to the folding axis F.

The width W of the first surface 411-1 and the second surface 411-0 of the extension 411 may range from 0.5 mm to 3 mm.

Referring to FIG. 9B, the extensions 421 may be formed in a trapezoidal shape. Each of the extensions 421 may include a first surface 421-1 that forms part of the upper surface 401 of the slit area 400 and a second surface 421-2 that forms part of the lower surface 402 of the slit area 400. The first surface 421-1 of the extension 421 may have a first width W1, and the second surface 421-2 of the extension 421 may have a second width W2 greater than the first width W1. The widths W1 and W2 may be lengths measured in the direction of the folding axis F. The extension 421 may have a gradually decreasing width toward the upper surface 401 of the slit area 400.

The areas of the first surfaces 421-1 of the extensions 421 illustrated in FIG. 9B may be smaller than the areas of the first surfaces 411-1 of the extensions 411 illustrated in FIG. 9A. Accordingly, a possibility that foreign matter is located between the slit area 400 and the display module 300 may be decreased, and thus damage to the display module 300 by foreign matter may be reduced.

An electronic device according to an embodiment of the disclosure may include a first housing (e.g., the first housing structure 110 of FIG. 1), a second housing (e.g., the second housing structure 120 of FIG. 1) that is connected to the first housing so as to be foldable, with a folding axis (e.g., the axis F of FIG. 1) between the first housing and the second housing, a display module (e.g., the display 130 of FIG. 1 or the display module 300 of FIGS. 4A and 4B) that includes a first area (e.g., the first area 131a of FIG. 1) disposed on the first housing and formed to be a flat surface, a second area (e.g., the second area 131b of FIG. 1) disposed on the second housing and formed to be a flat surface, and a folding area formed between the first area and the second area and formed to be a flat surface or a curved surface, and a plate disposed on a rear surface of the display module, the plate (e.g., the plate 132 of FIG. 3) including a first plate (e.g., the first plate 1321 of FIG. 3 or the first plate 330 of FIG. 5) that is coupled to the first area and a second plate (e.g., the second plate 1322 of FIG. 3 or the second plate 340 of FIG. 5) that is coupled to the second area. The first plate may include a first slit area (e.g., the first slit area 333 of FIG. 6) that includes a plurality of first extensions (e.g., the first extensions 334 of FIG. 6) extending toward the second plate and a plurality of first slits formed between the plurality of first extensions. The second plate may include a second slit area (e.g., the second slit area 343 of FIG. 6) that includes a plurality of second extensions (e.g., the second extensions 344 of FIG. 6) extending toward the first plate and a plurality of second slits formed between the plurality of second extensions. The electronic device may include a folded state in which the folding area is formed to be a curved surface and a flat state in which the folding area is formed to be a flat surface.

The first extensions and the second extensions may extend in directions perpendicular to the folding axis.

A portion of each of the first extensions may be formed to correspond to the first area of the display module, and the remaining portion of the first extension may be formed to correspond to the folding area of the display module. A portion of each of the second extensions may be formed to correspond to the second area of the display module, and the remaining portion of the second extension may be formed to correspond to the folding area of the display module.

The first slit area and the second slit area may be disposed in zigzags such that the first extensions extend toward the second slits and the second extensions extend toward the first slits.

In the folded state, at least part of each of the first extensions may extend in a direction of a tangential surface of the folding area, and in the folded state, at least part of each of the second extensions may extend in a direction of a tangential surface of the folding area.

Each of the first extensions may include a first surface that faces the rear surface of the display module in the flat state and has a first width and a second surface that is opposite to the first surface and has a second width, and each of the second extensions may include a third surface that faces the rear surface of the display module in the flat state and has a third width and a fourth surface that is opposite to the third surface and has a fourth width.

The first width may be smaller than the second width, and the third width may be smaller than the fourth width.

The first width may be substantially the same as the second width, and the third width may be substantially the same as the fourth width.

In the flat state, the first extensions and the second extensions may be disposed to be spaced apart from the rear surface of the display module at a predetermined interval.

The first extensions may extend by a first length in a direction perpendicular to the folding axis, and the second extensions may extend by a second length the same as the first length in an opposite direction to the direction in which the first extensions extend.

The first plate may further include a first attached area (e.g., the first attached area 331 of FIG. 5) that is coupled to the rear surface of the display module and a first unattached area (e.g., the first unattached area 332 of FIG. 5) that extends from the first attached area, the second plate may further include a second attached area (e.g., the second attached area 341 of FIG. 5) that is coupled to the rear surface of the display module and a second unattached area (e.g., the second unattached area 342 of FIG. 5) that extends from the second attached area, and in the folded state, the first unattached area and the second unattached area may be spaced apart from the folding area.

The first attached area may be attached to part of the first area of the display module, and the second attached area may be attached to part of the second area of the display module.

The first attached area and the first unattached area may form a first boundary, the second attached area and the second unattached area may form a second boundary, the folding axis may be formed between the first boundary and the second boundary, and a distance between the first boundary and the second boundary may be greater than a width of the folding area of the display module.

The first attached area may be formed by a first adhesive layer disposed on the rear surface of the display module, and the second attached area may be formed by a second adhesive layer disposed on the rear surface of the display module.

The display module may include a metal plate (e.g., the metal plate 355 of FIG. 7) that forms the rear surface of the display module, the metal plate may include a lattice structure (e.g., the lattice structure 3551 of FIG. 7) that includes an opening extending in a direction of the folding axis, and the lattice structure may be formed in a position corresponding to the folding area.

A display assembly according to an embodiment of the disclosure may include a display module including a cover layer that forms a surface of the display assembly, a panel layer disposed under the cover layer and including a pixel array, and a buffer layer disposed under the panel layer, a first plate disposed under the display module, and a second plate disposed under the display module and spaced apart from the first plate at a predetermined interval. The first plate may include a first coupled area coupled to a rear surface of the display module and a first uncoupled area that is not coupled to the rear surface of the display module and that extends from the first coupled area toward the second plate and has a plurality of first slits formed therein. The second plate may include a second coupled area coupled to the rear surface of the display module and a second uncoupled area that is not coupled to the rear surface of the display module and that extends from the second coupled area toward the first plate and has a plurality of second slits formed therein.

At least a partial area of the display module may be formed to be a bendable area, and the first plate and the second plate may be coupled to the rear surface of the display module such that the first slits and the second slits correspond to the bendable area.

The first plate and the second plate may be formed such that the first slits and the second slits are disposed in zigzags.

Each of the first plate and the second plate may be formed of a metallic material.

The first coupled area may be coupled to one side of the bendable area, and the second coupled area may be coupled to an opposite side of the bendable area.

Damage to the display module by foreign matter may be prevented by reducing an area where the foreign matter is likely to be located between the display module and the plate.

In addition, embodiments the disclosure may provide various effects that are directly or indirectly recognized.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute the one or more instructions, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first housing;
a second housing connected to the first housing so as to be foldable, with a folding axis between the first housing and the second housing;
a display module including:
a first area disposed on the first housing and formed to be a flat surface,
a second area disposed on the second housing and formed to be a flat surface, and
a folding area formed between the first area and the second area and formed to be a flat surface or a curved surface; and
a plate disposed on a rear surface of the display module, the plate including:
a first plate coupled to the first area, the first plate including a first attached area coupled to the rear surface of the first area and a first unattached area extending from the first attached area and
a second plate coupled to the second area, the second plate including a second attached area coupled to the rear surface of the second area and a second unattached area extending from the second attached area
wherein at least a portion of the first unattached area is formed as a first slit area including:
a plurality of first extensions, and
a plurality of first slits formed between the plurality of first extensions,
wherein at least a portion of the second unattached area is formed as a second slit area including:
a plurality of second extensions, and
a plurality of second slits formed between the plurality of second extensions,
wherein the electronic device is capable of entering a folded state in which the folding area is formed to be a curved surface and a flat state in which the folding area is formed to be a flat surface,
wherein in the flat state a space for foreign matter to fall through is defined between the rear surface of the display module and the first slit area and between the rear surface of the display module and the second slit area,
wherein each of the first extensions includes a first surface configured to face the rear surface of the display module in the flat state and having a first width, and a second surface opposite to the first surface and having a second width greater than the first width, and
wherein each of the second extensions includes a third surface configured to face the rear surface of the display module in the flat state and having a third width, and a fourth surface opposite to the third surface and having a fourth width greater than the third width.

2. The electronic device of claim 1,
wherein the first extensions extend toward the second plate and the second extensions extend toward the first plate, and
wherein the first extensions and the second extensions extend in directions perpendicular to the folding axis.

3. The electronic device of claim 1,
wherein a portion of each of the first extensions is formed to correspond to the first area of the display module, and the remaining portion of the first extension is formed to correspond to the folding area of the display module, and
wherein a portion of each of the second extensions is formed to correspond to the second area of the display module, and the remaining portion of the second extension is formed to correspond to the folding area of the display module.

4. The electronic device of claim 1, wherein the first slit area and the second slit area are disposed in zigzags such that the first extensions extend toward the second slits and the second extensions extend toward the first slits.

5. The electronic device of claim 1,
wherein in the folded state, at least part of each of the first extensions extends in a direction of a tangential surface of the folding area, and
wherein in the folded state, at least part of each of the second extensions extends in a direction of a tangential surface of the folding area.

6. The electronic device of claim 1, wherein in the flat state, the first extensions and the second extensions are disposed to be spaced apart from the rear surface of the display module at a predetermined interval.

7. The electronic device of claim 1,
wherein the first extensions extend by a first length in a direction perpendicular to the folding axis, and
wherein the second extensions extend by a second length the same as the first length in an opposite direction to the direction in which the first extensions extend.

8. The electronic device of claim 1,
wherein in the folded state, the first unattached area and the second unattached area are spaced apart from the folding area.

9. The electronic device of claim 1,
wherein the first attached area is attached to part of the first area of the display module, and
wherein the second attached area is attached to part of the second area of the display module.

10. The electronic device of claim 1,
wherein the first attached area and the first unattached area form a first boundary,
wherein the second attached area and the second unattached area form a second boundary,
wherein the folding axis is formed between the first boundary and the second boundary, and
wherein a distance between the first boundary and the second boundary is greater than a width of the folding area of the display module.

11. The electronic device of claim 1,
wherein the first attached area is attached by a first adhesive layer disposed on the rear surface of the display module, and
wherein the second attached area is attached by a second adhesive layer disposed on the rear surface of the display module.

12. The electronic device of claim 1,
wherein the display module includes a metal plate configured to form the rear surface of the display module,
wherein the metal plate includes a lattice structure including an opening extending in a direction of the folding axis, and
wherein the lattice structure is formed in a position corresponding to the folding area.

13. A display assembly comprising:
a display module including:
a cover layer configured to form a surface of the display assembly,
a panel layer disposed under the cover layer and including a pixel array, and
a buffer layer disposed under the panel layer;
a first plate disposed under the display module; and
a second plate disposed under the display module and spaced apart from the first plate at a predetermined interval,
wherein the first plate includes:
a first coupled area coupled to a rear surface of the display module, and
a first uncoupled area not coupled to the rear surface of the display module, the first uncoupled area extending from the first coupled area toward the second plate and having a plurality of first extensions and a plurality of first slits formed between the plurality of first extensions, and
wherein the second plate includes:
a second coupled area coupled to the rear surface of the display module, and
a second uncoupled area not coupled to the rear surface of the display module, the second uncoupled area extending from the second coupled area toward the first plate and having a plurality of second extensions and a plurality of second slits formed between the plurality of second extensions,
wherein at least a partial area of the display module is formed to be a bendable area deformable to a flat surface or a curved surface, and
wherein in a flat state in which the bendable area substantially forms the flat surface, a space for foreign matter to fall through is defined between the rear surface of the display module and the first uncoupled area and between the rear surface of the display module and the second uncoupled area,
wherein each of the first extensions includes a first surface configured to face the rear surface of the display module in the flat state and having a first width, and a second surface opposite to the first surface and having a second width greater than the first width, and
wherein each of the second extensions includes a third surface configured to face the rear surface of the display module in the flat state and having a third width, and a fourth surface opposite to the third surface and having a fourth width greater than the third width.

14. The display assembly of claim 13,
wherein the first plate and the second plate are coupled to the rear surface of the display module such that the first slits and the second slits correspond to the bendable area.

15. The display assembly of claim 13, wherein the first plate and the second plate are formed such that the first slits and the second slits are disposed in zigzags.

16. The display assembly of claim 13, wherein each of the first plate and the second plate is formed of a metallic material.

17. The display assembly of claim 13,
wherein the first coupled area is coupled to one side of the bendable area, and
wherein the second coupled area is coupled to an opposite side of the bendable area.

18. The display assembly of claim 13, further comprising first and second areas formed to be flat surfaces, and
wherein the bendable area is formed between the first area and the second area.

19. The display assembly of claim 13, wherein the buffer layer comprises a polyimide (PI) substrate.

20. The display assembly of claim 19, further comprising a metal plate arranged between the PI substrate and the first and second plates.

\* \* \* \* \*